United States Patent [19]

O'Hara et al.

[11] Patent Number: 5,061,892

[45] Date of Patent: Oct. 29, 1991

[54] ELECTRICAL TEST PROBE HAVING INTEGRAL STRAIN RELIEF AND GROUND CONNECTION

[75] Inventors: Steve O'Hara, Vancouver; Mark Nightingale, Camas; Glen Aukstikalnis, Vancouver, all of Wash.

[73] Assignee: Tektronix, Inc., Beaverton, Oreg.

[21] Appl. No.: 538,344

[22] Filed: Jun. 13, 1990

[51] Int. Cl.⁵ .................. G01R 1/067; H01R 4/00; H01R 11/18; H01R 43/04
[52] U.S. Cl. .................................. 324/149; 29/842; 29/844; 29/862; 174/75 C; 174/89; 439/482; 439/585
[58] Field of Search ............. 324/72.5, 149, 158 P; 439/482, 581, 585; 29/842–844, 854, 857, 861–863, 882; 174/75 C, 89

[56] References Cited

U.S. PATENT DOCUMENTS

| 2,883,619 | 4/1959 | Kobbe et al. | 324/149 X |
| 2,884,597 | 4/1959 | Miller | 324/149 |
| 3,141,924 | 7/1964 | Forney, Jr. | 174/75 C |
| 3,315,218 | 4/1967 | Aker | 439/585 X |
| 3,826,981 | 7/1974 | Ross | 324/149 X |
| 3,828,298 | 8/1974 | Schumacher | 174/75 C |
| 4,209,742 | 6/1980 | Bender et al. | 324/72.5 |

FOREIGN PATENT DOCUMENTS 2125236 6/1983 United Kingdom .

Primary Examiner—Gerard R. Strecker
Attorney, Agent, or Firm—William K. Bucher

[57] ABSTRACT

An improved electrical test probe has a electrically conductive strain relief adapter mounted on a substrate for accepting a conductive cable having a central conductor and an outer shielding conductor separated by a dielectric layer. The conductive cable is inserted into the strain relief adapter with the outer shielding conductor in electrical contact with the adapter. The substrate is disposed within an electrically conductive elongate hollow body with the body being deformed proximate the location of the strain relief adapter to secure the substrate in the body and to provide electrical continuity between the outer shielding conductor and the substrate and the outer shielding conductor and the hollow body. The adapter further provides strain relief for the center conductor of the conductive cable and mechanical support for the substrate.

3 Claims, 3 Drawing Sheets

ELECTRICAL TEST PROBE HAVING INTEGRAL STRAIN RELIEF AND GROUND CONNECTION

BACKGROUND OF THE INVENTION

The present invention relates generally to electrical test probes for oscilloscopes and other measuring, monitoring and signal processing instruments and more particularly to an improved electrical test probe having integral strain relief and ground connection.

A commonly used design for electrical test probes is an electrically conductive elongate tubular body made of nickel plated brass having a substrate disposed therein. The substrate contains either passive or active circuity to minimize probe loading and to terminate the probe in the characteristic impedance of the measuring device. The elongate tubular body has a probing tip at one end that is secured in the tubular body by an insulating plug. The probing tip extends through the insulating plug and is exposed within the tubular body. The substrate is electrically connected to the probing tip by electrically conductive elastomeric material or other such conventional connecting methods. Surrounding a substantial portion of the tubular body is an insulating material, such as injected molded plastic parts. Various methods are used for attaching the plastic parts to the tubular body, such as press fitting, gluing, or injection molding of the plastic directly onto the body. The plastic parts are generally formed with an outwardly extending flange that serves as a finger stop and guard. The plastic parts also serve as an outer housing for securing a transmission line, or cable, to the probe.

The transmission cable has a central conductor encased in a dielectric material and surrounded by an outer conductive shielding material. The outer conductive shielding material is covered by an insulating material. The central conductor is electrically connected to the substrate and the outer shielding material is electrically connected to the tubular body. Many methods are employed for connecting the transmission cable to the electrical test probe.

One such method is described in U.S. Pat. No. 4,209,742 entitled "Modular Probe System" and assigned to the assignee of the present invention. The transmission line in the modular probe system is secured in a connector plug that mates with the tubular body of the probe. An injected molded plastic housing is formed around the tubular body having a central bore into which the tubular body extends. The connector plug fits into the central bore and a pair of coaxially disposed contact members separated from each other by a dielectric material mate with the probe tip and the tubular body. The inner contact member is electrically connected to the central conductor of the transmission line and the outer contact member is electrically connected to the outer conductive shield. The outer contact member is supported in the plug by an integral annular member. A metal sleeve is crimped over the inner end of the annular member and an end portion of the cable to anchor the contacts to the cable. An insulating cove is formed over the plug.

A major drawback to this design and other types of designs where bushings, threaded connectors, and the like are used is the number of components needed for assembling the probe and the time required to manufacture the probe.

What is needed is a simple, low cost electrical probe that requires a minimum number of parts for connecting the transmission cable to the probe while at the same time providing the necessary electrical connections and strain relief for reliability.

SUMMARY OF THE INVENTION

Accordingly the present invention is an improved electrical test probe having an electrically conductive strain relief adapter mounted on a substrate for accepting a conductive cable having a central conductor and an outer shielding conductor separated by insulating material. The substrate is disposed within an elongate electrically conductive hollow body and the electrically conductive strain relief adapter and the outer conductor are in electrical contact with an elongate electrically conductive hollow body by deformation of the hollow body proximate the strain relief adapter. The electrically conductive strain relief adapter electrically connects the outer shield conductor to the substrate and the elongate electrically conductive hollow body and provides strain relief for the central conductor and mechanical support for the substrate.

The objects, advantages and novel features of the present invention are apparent from the following detailed description when read in conjunction with the appended claims and attached drawings.

DETAILED DESCRIPTION OF THE PREFERRED EMBODIMENT

Figure 1:
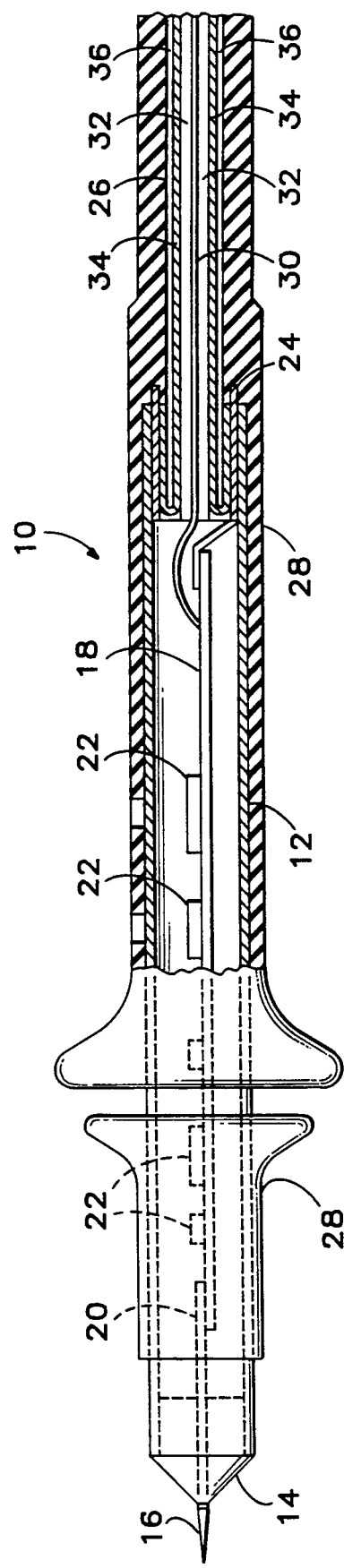
FIG. 1 is a side view, partially broken and partially in section of the improved electrical test probe of the present invention.

Referring to FIG. 1, there is shown an improved electrical test probe 10 having having an elongate electrically conductive hollow body 12. Disposed within one end of the body 12 is an insulative plug 14 having an electrically conductive probing tip 16 coaxially disposed therein and extending out of the plug 14 in both directions. The portion of the probing tip 16 extending into the hollow body 12 is electrically connected to a substrate 18 by a spring loaded electrical contact 20 electrically connected to the substrate 18. Mounted on the substrate 18 are electrical components 22, such as resistors and capacitors, for compensating the probe. Mounted on and in electrical contact with the substrate is an electrically conductive strain relief adapter 24 that provides a ground connection for the substrate 18. The strain relief adapter 24 also provides mechanical support for the substrate 18 after insertion of the substrate 18 into the hollow body 12. A conductive cable 26 is inserted into the strain relief adapter 24 and secured therein by crimping the hollow body 12 at the location of the strain relief adapter 24. Insulating material 28, such as a thermoplastic elastomer, is molded around a substantial portion of the elongate electrically conductive hollow body 12 and a portion of the conductive cable 26 to provide electrical insulation and strain relief for the cable 26. The other end of the cable 26 is connected to an appropriate type connector for connecting to a piece of test equipment, such as an oscilloscope or the like.

The conductive cable 26 has a central conductor 30 surrounded by a polypropylene foam insulating layer 32. Surrounding the insulating layer 32 is an outer shielding conductor 34 which in turn is surrounded by an insulating layer 36. The outer shielding conductor 34 is connected to ground through the test equipment. Prior to the insertion of the cable 26 into the strain relief adapter 24, the outer insulating layer 36 on the cable 26 is removed exposing the outer shielding conductor 34. The outer shielding conductor 34, which is generally braided wire, is folded back over the insulating layer 36 exposing the polypropylene foam layer 32. A portion of the layer 32 is removed exposing the central conductor 30. The conductive cable 26 is inserted into the strain relief adapter 24 until the folded back braided outer shielding conductor 34 is within the adapter 24. The strain relief adapter 24 provides the electrical connection between the outer shielding conductor 34 and the substrate 18. The center conductor 30 is electrically connected to the substrate 18 in a conventional manner, such as by soldering.

The substrate 18 is inserted into the elongate electrically conductive hollow tube 12 until the spring loaded electrical contact 20 on the substrate 18 mates with the probing tip 16. The hollow tube 12 is then crimped at the location of the electrically conductive strain relief adapter 24 to to secure the substrate 18 in the hollow tube 12. The crimping of the hollow tube 12 establishes the electrical ground contact between the outer shielding conductor 34 and the tube 12 through the strain relief adapter 24 and provides strain relief for the center conductor 30 by capturing the conductor cable in the strain relief adapter 24.

Figure 2:
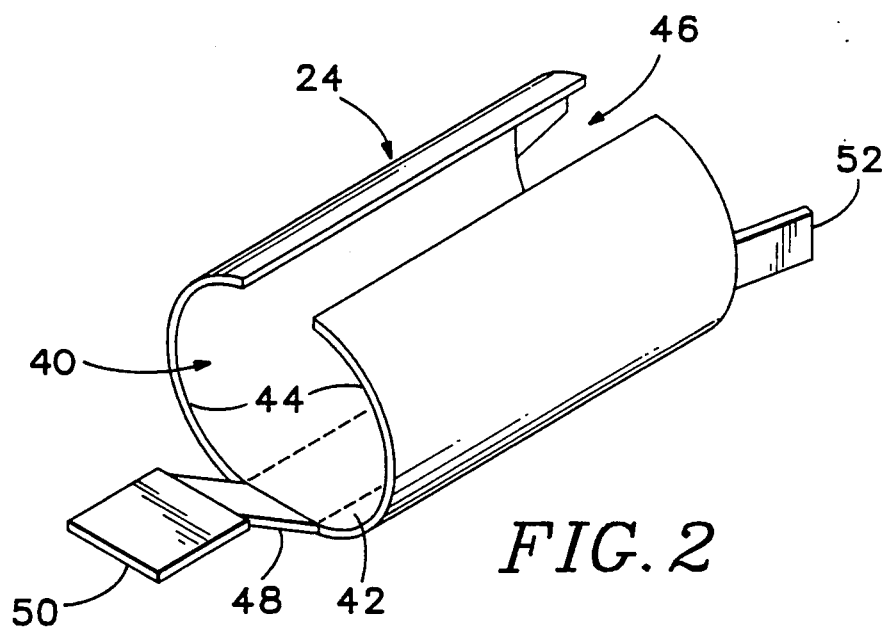
FIG. 2 is a perspective view of the electrically conductive strain relief adapter for an improved electrical test probe of the present invention.
Figure 3:
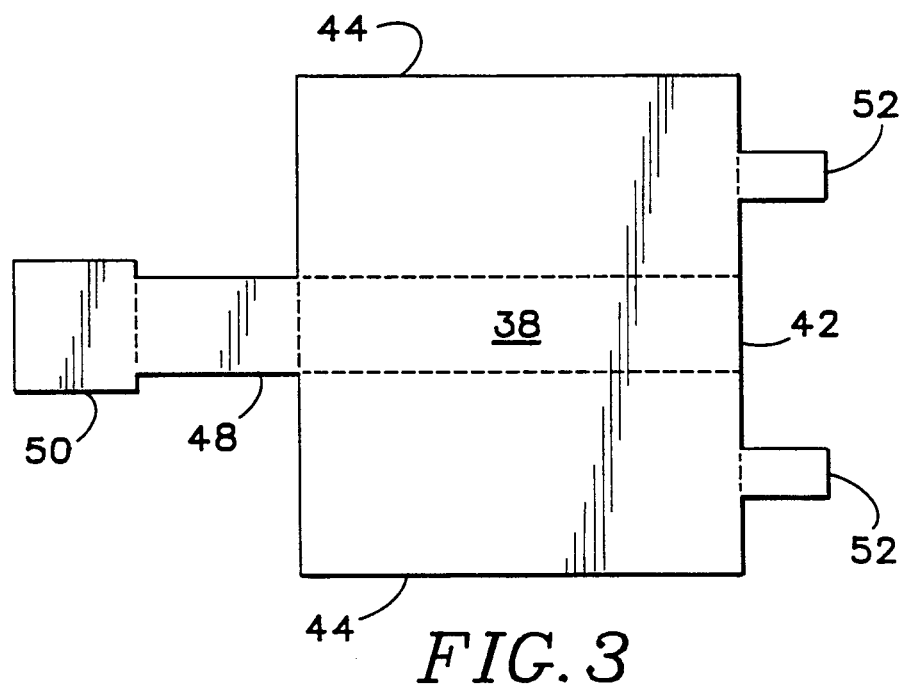
FIG. 3 is a flat sheet of material for fabricating the electrically conductive strain relief adapter having the various members formed thereon.

Referring now to FIG. 2, there is shown a perspective view of the electrically conductive strain relief adapter 24. The strain relief adapter 24 is fabricated from a flat sheet of berrylium-copper material 38 having the various members formed therein, as is shown in FIG. 3. The flat sheet is formed into an approximate tubular shaped member 40 having a base 42 and arcuate extending sides 44 forming a slot 46 opposite the base 42. Extending from the base 42 of the tubular shaped member 40 is an angularly extending flat member 48 that transitions into a flat surface 50 that is approximately parallel with the base 42 of the tubular shaped member 40. At the opposite end of the tubular shaped member 40 are flanges 52 extending from the arcuately extending sides 44.

Figure 4:
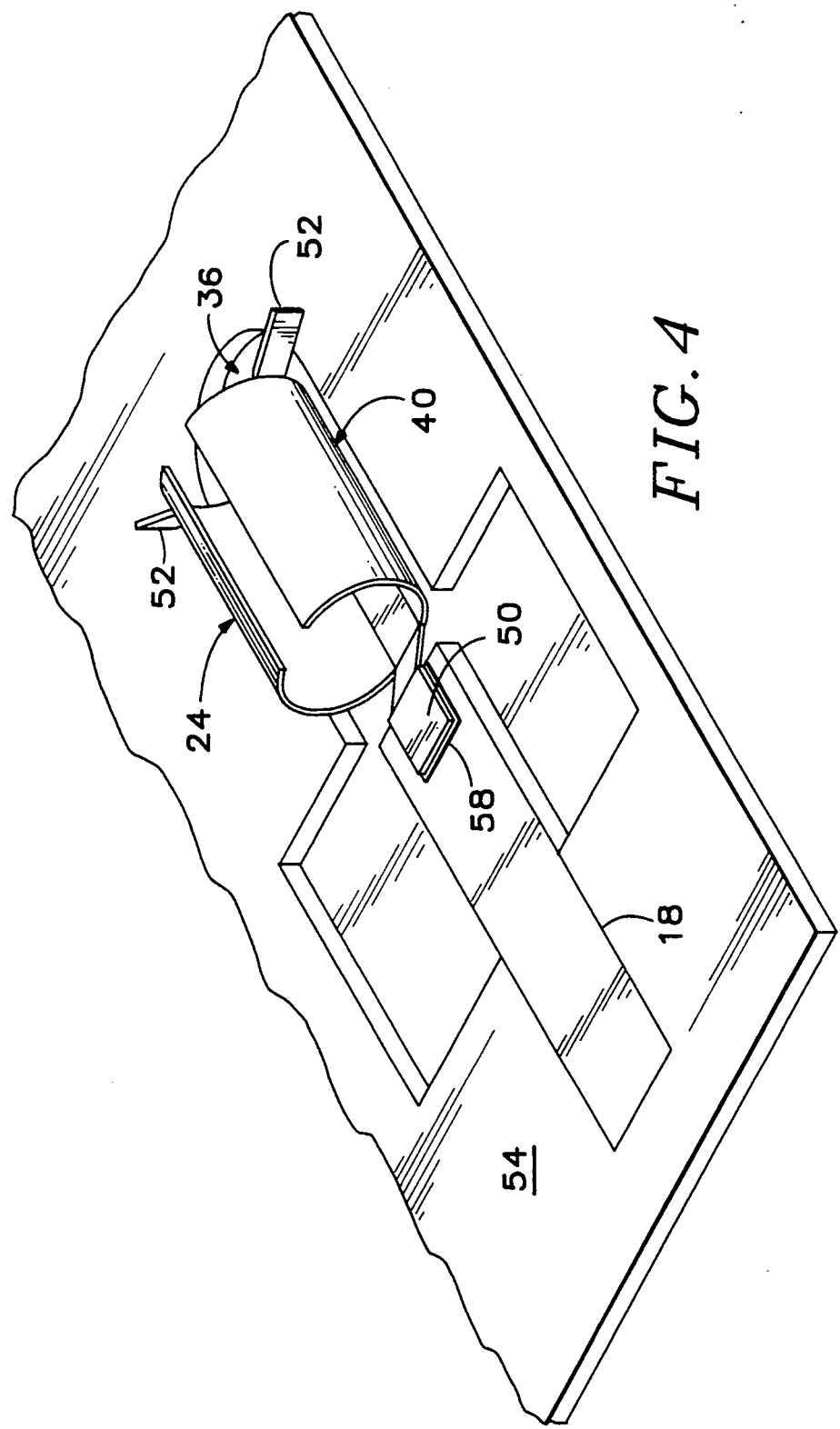
FIG. 4 is a perspective view of the electrically conductive strain relief adapter mounted on a substrate formed on a circuit board.

The electrically conductive strain relief adapter 24 is surface mounted to the substrate 18 prior to connecting the conductive cable 26. Multiple substrates are patterned on a large piece of circuit board material 54 or the like as is known in the circuit board art, a single substrate on circuit board being representatively shown in FIG. 4. Slots 56 are drilled adjacent to each of the substrates 18 formed on the circuit board 54 for accepting the strain relief adapters 24. The strain relief adapters 24 are placed in the slots 56 formed in the circuit board 54 with the flat transition surface 50 of the adapters 24 resting on corresponding soldering pads 58 on the substrates 18. The flanges 52 on the tubular shaped members 40 rest on top of the circuit board to support the adapters 24 in the slots 56. A surface mount soldering process is used to solder the flat transition surfaces 50 of the adapters 24 to the soldering pads 58. After the soldering process the flanges 52 are folded against the tubular shaped member 40 or removed.

An improved electrical test probe has been described having a electrically conductive strain relief adapter for providing grounding connections between an outer shielding conductor on a conductive cable and a substrate disposed with an elongate electrically conductive hollow body and between the hollow body and the outer shielding conductor. The strain relief adapter further provides mechanical support for the substrate in the hollow body and strain relief for a central conductor of a conductive cable connected to the electrical test probe. These and other aspects of the present invention are set forth in the appended claims.

We claim:

1. An improved electrical test probe for use with measurement test instrument having an input connector with a centrally disposed signal conductor surrounded by electrical ground conductor for coupling electrical signals from the improved electrical test probe to the measurement test instrument comprising:

an electrically conductive hollow body having a probing tip coaxially disposed in one end;

a conductive cable disposed at the other end of the electrically conductive hollow body and having a central conductor separated from a surrounding outer shielding conductor by an insulating member;

a substrate disposed within the electrically conductive hollow body making electrical contact with the probing tip and having electrical components thereon for compensating the electrical signals acquired by the electrical test probe; and an electrically conductive strain relief adapter disposed within the electrically conductive hollow body and having a proximate tubular shaped member with a slot formed therein for receiving the conductive cable therethrough with the outer shielding conductor making electrical contact with the tubular member and a flat member extending from and being integrally formed with the tubular member opposite the slot for mounting the strain relief adapter on the substrate opposite the probing tip, the central conductor of the conductive cable making a first electrical connection with the compensating electrical components on the substrate and the flat member making a second electrical connection on the substrate, the electrically conductive strain relief adapter being deformed as a function of crimping the electrically conductive hollow body about the strain relief adapter for capturing the conductive cable within the tubular member for providing strain relief for the central conductor at the first electrical connection and for providing electrical connectivity between the outer shielding conductor and the second electrical connection on the substrate and between the outer conductor and the electrically conductive hollow body.

2. An improved method of manufacturing an electrical test probe having an electrically conductive hollow body with a probing tip coaxially disposed in one end thereof and a substrate insertable into the hollow body having electrical components thereon for compensating electrical signals acquired by the electrical test probe, the improved method comprising:

mounting an electrically conductive strain relief adapter to the substrate, the electrically conductive strain relief adapter having a proximate tubular shaped member with a slot formed therein and a flat member extending from and being integrally formed with the tubular member opposite the slot with the flat member making an electrical connection to the substrate;

inserting a conductive cable having a central conductor and an outer shielding conductor separated by an insulating material through the tubular shaped member of the electrically conductive strain relief adapter, the outer shielding conductor being in electrical contact with the tubular shaped member;

electrically connecting the central conductor to the substrate to provide and electrical connection between the compensating electrical components and the conductive cable;

inserting the substrate into the electrically conductive hollow body for electrically connecting the substrate with the probing tip; and crimping the electrically conductive hollow body proximate the electrically conductive strain relief adapter to deform the tubular shaped member for capturing the conductive cable within the tubular shaped member to provide strain relief for the central conductor connection on the substrate and to provide an electrical contact between the outer shielding conductor and the elongate electrically conductive hollow body.

3. The improved method of manufacturing an electrical test probe as recited in claim 2 wherein the mounting step further comprises:

forming the substrate with a soldering pad thereon on a circuit board;

drilling a slot in the circuit board adjacent to the substrate;

locating the tubular shaped member of the electrically conductive strain relief adapter within the slot formed in the circuit board and locating the flat member on the soldering pad of the substrate; and soldering the flat member of the electrically conductive strain relief adapter to the substrate.

* * * * *